(12) United States Patent
Horn et al.

(10) Patent No.: US 6,222,261 B1
(45) Date of Patent: Apr. 24, 2001

(54) BARRIER LAYERS FOR THIN FILM ELECTRONIC MATERIALS

(75) Inventors: Stuart B. Horn, Fairfax; Elizabeth H. Nelson, Springfield, both of VA (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 0 days.

(21) Appl. No.: 09/303,637

(22) Filed: May 3, 1999

(51) Int. Cl.$^7$ .................................................. H01L 23/053
(52) U.S. Cl. .................... 257/701; 257/700; 257/701; 257/702; 257/703
(58) Field of Search .................................. 257/701, 702, 257/703, 700

(56) References Cited

U.S. PATENT DOCUMENTS

| | | | |
|---|---|---|---|
| 4,882,212 | * 11/1989 | SinghDeo et al. | 428/76 |
| 5,057,648 | * 10/1991 | Blough et al. | 174/52.4 |
| 5,347,426 | * 9/1994 | Dermarkar et al. | 361/708 |
| 5,397,918 | * 3/1995 | Yokochi et al. | 257/703 |
| 5,747,873 | * 5/1998 | Talisa et al. | 257/661 |
| 5,798,566 | * 8/1998 | Sato et al. | 257/712 |
| 5,818,105 | * 10/1998 | Kouda | 257/696 |
| 6,054,762 | * 4/2000 | Sakuraba et al. | 257/703 |

FOREIGN PATENT DOCUMENTS

| | | | |
|---|---|---|---|
| 000543121 | * 4/1993 | (GB) | 257/703 |
| 002260541 | * 4/1993 | (GB) | 257/703 |

* cited by examiner

Primary Examiner—Eddie C. Lee
Assistant Examiner—Edgardo Ortiz
(74) Attorney, Agent, or Firm—Milton W. Lee; John E. Holford; Alain L. Bashore

(57) ABSTRACT

A hybrid microelectronic circuit formed from two or more chips of different electronic materials and having a preformed barrier layer having at least a nanostructured plastic/ceramic layer between the chips and preferably including a thin layer of an aerogel also.

11 Claims, 2 Drawing Sheets

BARRIER LAYERS FOR THIN FILM ELECTRONIC MATERIALS

BACKGROUND OF THE INVENTION

1. Field of the Invention

The invention relates to hybrid electronic and photoelectric devices manufactured by means of thin film and monolithic layering techniques.

2. Description of Prior Art

Most electronic devices are now made using thin layers of material on a supporting substrate such as silicon, gallium arsenide, mercury cadmium telluride, sapphire, plastic or one of various other similar types of materials. These devices are being combined with one another and other film structures in layers to form more exotic devices. Upon interfacing these layers and/or devices with each other special considerations have to be addressed such as electrical isolation, electrical conduction, thermal isolation, differential thermal expansion, and chemical compatibility.

As an example, large arrays of infrared photodetectors made with HgCdTe or pyroelectric materials are being combined with Charge-Coupled Devices (CCD's) made on silicon substrates. The photodiodes are very temperature sensitive and become extremely noisy unless maintained near the boiling point of liquid nitrogen. The CCD's work well at room temperatures and become an undesirable thermal load on the photodiodes unless adequate insulation is placed between them.

In applicant's patent application Ser. No. 07/823,749, filed Jan. 22, 1992 and issued Apr. 5, 1994 as U.S. Pat. No. 5,300,807, there is described a method of forming a thin layer of plastic which is sandwiched between hybrid devices, such as detector arrays and CCD's, during their assembly. It has been proposed that parts of these hybrid structures not be preassembled, but that the arrays be formed on the CCD structures, preferably on an aerogel insulating layer. It would also be advantageous not to preform the cross-linking electrodes on the CCD's; so that the same CCD's can be utilized in a variety of Time Delay Integration (TDI) readout scenarios with the same or different arrays. The surface of the aerogel, however, is too porous to form the semiconductor or metallization layers on, and the plastic preparation layer previously suggested cannot withstand the rigors of sputtering and other techniques used to form these layers.

SUMMARY OF THE INVENTION

To improve a hybrid microelectronic circuit chip, a dry process is used to join one or more nanostructured barrier layers to a first layer of the device, thereby forming a sturdy electrical and thermal barrier structure on which to form a succeeding layer. This barrier also may be added before and/or after the addition of a layer of material having an irregular and/or fragile surface, such as an aerogel. The term "nanostructured" as used in this application refers to a controlled layered or filamentary structure in the material which can limited to one nanometer, but broadly interpreted also includes such structures having minimum dimensions as large as a hundred nanometers.

One object of the invention, therefore, is to provide improved hybrid microelectronic devices which include nanostructured barrier layers that can be processed like a plastic, but are not damaged by wet chemical, sputtering and similar processing.

A further object of the invention is to provide an improved hybrid microelectronic device having at least one layer of delicate and/or porous material, such as an aerogel, coated with a nanostructured material as described above.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Hybrid devices comprise at least two different layers, chips or substrates on which microelectronic circuits are formed. The reasons for using two different substrates are numerous. There may be a need to juxtaposition pairs or larger groups of components to facilitate coupling them or minimize signal delay between them. There may be a space problem wherein the maximum device dimension is reduced by a factor roughly equal to the number of substrates used. There may also be a temperature differential that must be maintained between these substrates to permit their proper operation. There may simply be a cost reduction factor that favors making and assembling a separate substrate for each functional group of circuit elements that require similar processing and testing. More importantly the substrates may be totally different in composition to support different functions. Such a condition arises in the fabrication of photodetector arrays for the far infrared 8–14 micron wavelength spectral region.

Figure 1:
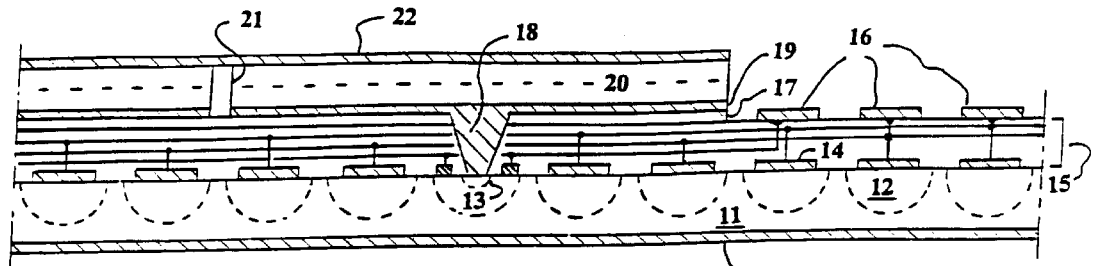
FIG. 1 shows a hybrid detector array and CCD readout circuit electrically and thermally isolated by a nanostructured plastic-ceramic barrier.

FIG. 1, for example, shows a combined photo detector and CCD. The most effective array in the above wavelength range currently requires photodiodes formed of elements from columns III&V or II&VI of the periodic table, preferably HgCdTe. The photodiode array is preferably used with a silicon CCD readout device. The base of the CCD is a common electrode 10 supported by a silicon substrate 11 doped in the usual manner to provide p or n carriers. An array of oppositely doped wells 12 are formed, usually by diffusion, through the substrate surface opposite the common electrode. Those wells, most of which are to be covered by the photodiodes, are arranged in equal groups each group associated with one photodiode. One well in each group has a smaller pocket 13 diffused therein of opposite polarity to form a charge injection device. Each well and pocket has its own electrode 14 and these are interconnected with one another by means of alternate layers of metal and oxidized silicon that constitute a complex chip passivation layer 15. By the same means these electrodes are also connected to edge electrodes 16 exposed on the top of the complex passivation layer. The latter are inputs for clock pulses to produce readout mode patterns, well understood in the art, such as the Time Delay Integration mode. Other edge electrodes and wells, resembling the charge injection electrode 18 and its wells 12 and 13, act as charge removal electrodes for video signals resulting from the combination and transfer of charges in all of the wells by the clock signals.

The central portion of the above passivation layer is covered by a barrier layer 17 that may serve several purposes. In this combination it forms a thermal barrier to allow the CCD and photodiodes to operate at different temperatures. It also protects one circuit while the other is being formed by sputtering. This barrier layer in the present invention is formed so that at least one of its surfaces is composed of a plastic-ceramic mixture in which the filaments or layers of ceramic particles are 1–100 nanometers thick. For some applications the barrier could be only a single layer of this material. Mica, alumina and other ceramics that can withstand over 1000° C. are readily available. These properties carry over to the plastic-ceramic mixtures as well.

Figure 3:
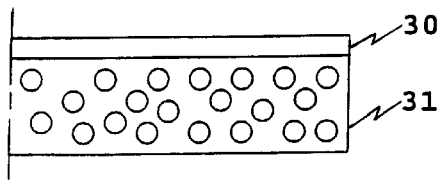
FIG. 3 shows an alternative structure for the barrier layer in FIG. 2 consisting of an aerogel covered by a nanostructured plastic-ceramic layer or coating.
Figure 4:
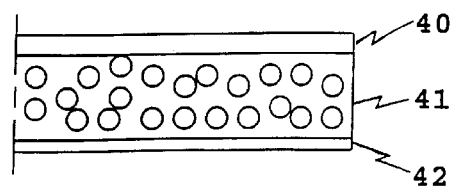
FIG. 4 shows yet another barrier layer which consists of a layer of aerogel coated on both sides with a nanostructured plastic-ceramic layer or coating.

As shown in FIGS. 3 and 4, it is preferred, however, that layer 17 also include both a layer 30 of the ceramic-plastic material and a layer 31 of silica aerogel; which by itself is fragile, porous to liquids and irregular on its surface; yet still is one of the best thermal barriers available. This material is described in an article "AEROGELS—HIGHLY TENUOUS SOLIDS WITH FASCINATING PROPERTIES", by J. Frick, *Journal of Noncrystalline Solids,* (North Holland, Amsterdam), Vol. 100, No. 1–3, pp 169–173. When HgCdTe photodiodes are used, these diodes are cooled to 77° K. Direct interfacing with a CCD would unnecessarily increase the cooling load and degrade CCD functions. The aerogel surface can be reinforced by adding the protective nanostructured layer 30 using the teachings in Applicant's Patent, cited above.

As shown in FIG. 4, the aerogel 41 may have only one face covered with a layer 40 of the nanostructured material. However, to form a self sustaining substrate structure, on which both chips of a hybrid can be formed, an additional layer 42 may be added to the remaining exposed face of the aerogel. All three of these layers can withstand temperatures over 1000° C. When confined between layers the aerogel can withstand considerable impact and vibration. The plastic-ceramic layers provide plane surfaces that are highly resistant to abrasion and are not porous. In short they are excellent surfaces on which to sputter metallic, ceramic or other types of layers used in the fabrication of integrated circuitry.

Figure 2:
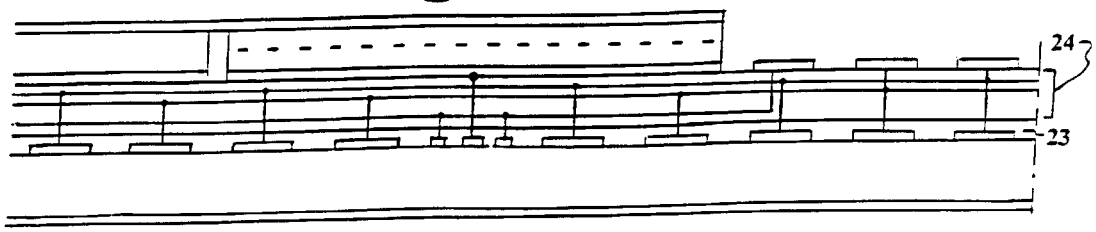
FIG. 2 shows a hybrid detector array and readout circuit electrically and thermally isolated by a nanostructured plastic-ceramic barrier, wherein the cross-linked electrode structure of the CCD is formed after the barrier layer is in place.

Referring again to FIG. 1, the individual electrodes 19 for all of the photodetectors can initially be sputtered or otherwise formed as one continuous layer directly on top of the barrier layer. Preformed tapered openings in the barrier, provided by means of photolithography or excimer laser action, for example, serve to form the electrode 18 for wells, like well 13, integral with the individual photodetector electrode 19, instead of soldering the two as has been the practice in the past. Similar structures are used in the complex passivation layer at each of the vertical leads shown, in both this Figure and FIG. 2. A composite layer 20 of IR sensitive materials, such as semiconductors or pyroelectric materials can then be deposited on the individual electrode layer. The definition of individual pixel detectors can generally be improved by horizontal and vertical edge grooves formed down to or slightly into the barrier. This can best be done by means of an ion or excimer laser beam. The resulting grooves or spaces 21 between elements can be left open or filled with one or both of the insulating materials, as used in the barrier, or other materials used in the past.

The upper surface is finally covered with a common electrode 22 transparent to radiation in the wavelength band for which the detectors are designed; i.e., for HgCdTe, 8–14 microns. When using the barrier of FIG. 4 the CCD need not be made first, but can be made on the detector-barrier combination or the barrier alone. In the former case, the openings for the charge injection electrode would be best made from the CCD side of the barrier, so that the taper shown will insure adequate formation of the small end of the electrode. Making CCD's is, however, a highly developed art, wherein the shapes of the wells and their electrodes plays a critical part in how fast and efficiently data transfer can be accomplished. Manufacture of two chip elements, using this technique, can also be used with other circuit substrate combinations involving germanium, cadmium telluride and gallium arsenide, for examples, and printed circuitry that operate with different wavelengths and speeds.

The design of the conductive network for photodetectors depends on the geometry of these detectors and their mode of operation. Arrays that are used for automatic target recognition or aerial mapping require large numbers of diodes for high resolution. Visual arrays as used for obstacle avoidance of gun sights require less resolution. The U.S. Army may decide to stock only a high resolution array and may use Time Delay Integration (TDI) to reduce the resolution by means of the conductive networks that couple the array to a CCD. This will greatly reduce the number of preamps, postamps and their associated elements in the output channels. Although these networks are usually formed directly on the CCD, it would also be advantageous, if a single type of CCD could be stocked for all applications. One way to accomplish this is to form the networks on the aerogel layer. Another approach is to form the photodiode array on a CCD which already has a conductor network covered with an aerogel or forming both the conductor network and the photodiode array on a similar aerogel covered CCD initially having electrodes but no conductor network.

Many electronic devices involve this type of boundary. To form such a barrier layer, the use of a structure composed of either high temperature polymers or high temperature polymer/ceramic nanocomposites (particles of both phases being equally fine in size) would be ideal. When the isolation layer is an aerogel, this barrier layer must be applied using a dry process and it must also be able to withstand the high processing temperatures necessary to fabricating infrared detector arrays.

The methods of making these materials is discussed in an article entitled "Nanostructured Materials Promise to Advance Range of Technologies" by Ron Dagani, pp 18–24, Chemical and Engineering News, Nov. 23, 1992. For example, the classic gas-phase condensation route to nanophase materials is discussed, wherein the precursor material is evaporated in a high-purity inert gas, transported via convection and condensed on a liquid-nitrogen-filled cold finger. The powdery material is then scraped from the cold finger, and consolidated, first in a low-pressure compaction device and then in a high-pressure unit, all in the same vacuum system. The compact may then be sintered, if desired, to yield a final polycrystalline ceramic shape. To make nanocomposites, two different metals can be evaporated and condensed at the same time. Nanophase Technologies of Darien Ill. supplies oxide powders to industrial users interested in exploring the properties and potential applications of these materials. Another source of these materials is the Nanodyne Corporation of Piscataway, N.J.

Nanocomposite structures of materials lead to dramatically different properties than those found in non-nanocomposite materials. For example, one can design a polymer nanocomposite material having the thermal properties of a ceramic material by using only a very small percentage, e.g. less than ten percent, of ceramic material while continuing to process the material as a conventional plastic. The polymer/ceramic nanocomposites by design have a more ordered molecular arrangement in addition to being able to withstand higher processing temperatures than standard polymers.

The properties of nanostructured materials are determined by a complex interplay among the building blocks and the interfaces between them. In nanophase ceramics and metals, for instance, the grains are so small that a relatively large volume of the solid consists of grain boundaries or interfaces. Strains and other forces acting through these grain boundaries can strongly influence the material's mechanical properties.

Figure 5:
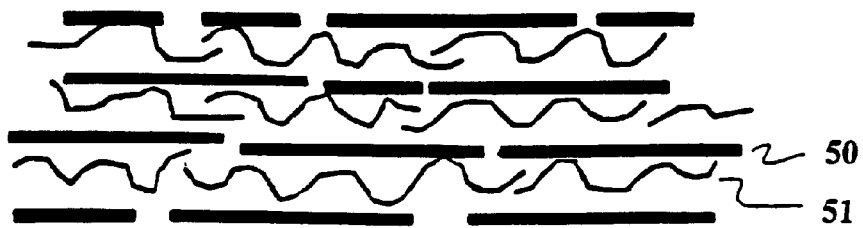
FIG. 5 shows a nanostructured layer or coating wherein single polymer chains are inserted between sheets of ceramic material.

As shown in FIG. 5, one way to process these materials is to sandwich polymer chains 51 between ultrathin layers of ceramic sheets or platelets 50, 1–100 microns thick. This approach allows one to design a nanocomposite that combines the high strength and thermal stability of a ceramic with the processability and crack-deflecting properties of a polymer. Nanosized gaps that exist between layers of ceramic oxides are infused with polymers. The resulting layers of material are extremely thin, so as to be essentially two dimensional. This configuration of molecules isolates the nanocomposites into a more oriented arrangement which can alter the materials' physical, electrical, optical, and mechanical properties. Insertion of single polymer chains between the sheets of a layered or mica-type silicate yields a highly ordered nanocomposite that blends the properties of polymer and ceramic, giving a nanocomposite which can be processed like a conventional plastic material. Further discussion of this material may be found in the article "Nanostructured Materials Promise to Advance Range of Technologies", *Chemical and Engineering News,* Nov. 23, 1992.

Figure 6:
FIG. 6 shows a nanostructured layer or coating wherein ceramic sheets are dispersed throughout masses of polymer chains.

In FIG. 6, single silicate sheets 60 are dispersed throughout a spaghetti-like mass 61 of polymer chains, producing a nanocomposite that can be processed much like conventional plastics. The process of making these ceramic/polymer nanocomposites has been likened to the "pouring of flavored syrup into the crystals of a thin Italian ice". Nanometer-sized gaps that exist between the layers of certain ceramic oxides are infused with either polymers or monomers that later are linked up to form the polymers.

The confinement of the polymer molecules in these two-dimensional spaces isolates them (to a degree) and forces them into a more orderly arrangement. This, in turn, has a major effect on the properties of the nanocomposite. For example, when polymers are intercalated between silicate sheets, they don't behave, on heating, the way bulk polymers do. Bulk amorphous polymers soften and become rubbery at their glass transition temperature, and crystalline polymers become liquid at their melting point. The intercalated polymers do not appear to undergo these transitions. This may be because the molecules' confinement hinders their translational and rotational motions. Furthermore, melting is a behavior of crystallites, which require more space to grow than is available in the nanometer-sized gaps of the silicate lattice.

Researchers At Cornell University also have shown that when molecules are intercalated in silicates, their thermal and oxidative stability increases dramatically. The molecules' confinement inside the ceramic lattice apparently protects them from engaging in degradative behavior. A related approach to ceramic/polymer nanocomposites involves homogeneously dispersing single, 1-nm-thick silicate sheets in a continuous polymer matrix. The advantage of this approach is that a small amount of ~silicate (less than 6% by weight) is sufficient to reinforce the polymer and greatly improve its properties. First explored by researchers at the Toyota Research Center in Nagoya, Japan, this method can be used to synthesize lightweight nanocomposites because so little ceramic is used. The low ceramic content also allows easy molding of the nanocomposites. They can be processed much like a conventional plastic.

Polyimide-silicate nanocomposites of this type have been shown to absorb less water and expand less on heating than bulk polyimide and the dielectric properties of ~nanocomposites are similar to those of the bulk polymer. These polymer/ceramic nanocomposites can be cast on a liquid subphase, lifted, dried and transferred to the isolation site according to the teachings in applicant's patent cited above. New, extremely high temperature polymer/ceramics which can withstand temperatures of 1200° C. and higher have been recently demonstrated, see "Commercially Important Materials Advances Cited", *Chemical Engineering News,* Oct. 3, 1994. These materials would also be ideal for this application. These high temperature polymers can also be processed and transferred under the techniques of applicant's U.S. Pat. No. 5,300,807 referenced above.

The polymer/ceramic nanocomposites may also be made bulk form. This reinforced polymer in bulk form is compatible with existing processing techniques for bulk polymers and can be used as a stand-alone isolation layer for above applications. In the prior art material of FIGS. 5 and 6, the ceramic provides rigidity and reinforcement, and the large number of interfaces dramatically improves the properties of the material.

According to the present invention, having obtained a quantity of nanostructured ceramic powder from an above mentioned manufacturer, a barrier layer between first and second semiconductor chips in a hybrid electronic circuit is formed by the following steps:

[A] Preparing a nanostructured mixture of 93½ parts of an adhesive polymer by weight with 6½ parts of ceramic platelets having a thickness in the range of 1 to 100 nanometers;

[B] Adding sufficient liquid polymerizer to completely liquify and polymerize the mixture;

[C] Placing a lifting ring part way into a fluid subphase denser than said mixture and which will not chemically react with the mixture;

[D] Pouring a first layer of the mixture onto the surface of said subphase surrounded by said ring;

[E] Heating and irradiating the first layer to accelerate polymerization;

[F] Lifting the ring and the first layer from the subphase;

[G] Drying the first layer in a non-humid environment; and

[H] Transferring the first layer from the ring to a broad face of one of the chips.

Step H may also include the following steps:

[H1] Attaching the first layer to a broad face of the first chip;

[H2] Detaching the first layer from said ring; and

[H3] Attaching the first layer to a broad face of the second chip.

Alternatively, when n hybrid circuits are being fabricated, Step H may include these steps:

[H1] Placing the first layer in contact with a separation sheet of material that does not permanently adhere to it;

[H2] Detaching the first layer from the ring;

[H3] Placing the sheet on a tray on top of a stack of any previously formed first layers;

[H4] repeating Steps C–H3 n–1 times;

[H5] Attaching the exposed first layer at the top of the stack to a broad face of the first chip;

[H6] Detaching the sheet from the first layer;

[H7] Repeating Steps H4–H6 n–1 times.

When the barrier layer includes a thin layer of silica aerogel, step H may include the following steps:

[H1] Attaching the thin layer to a broad face of the first chip before attaching the first layer; and

[H2] Attaching the first layer to cover the thin layer.

Alternatively when the barrier layer includes a thin layer of silica aerogel, step H may include the following steps:

[H1] Attaching the first layer to a broad face of the first chip before attaching the thin layer;

[H2] Attaching the thin layer to cover the first layer;

[H3] Repeating steps A–G to form a second layer; and

[H4] Attaching the second layer to the opposite broad face of the thin layer.

When a thin layer of aerogel is to be used as a substrate on which to form part or all of chips, step H may include the following steps:

[H1] Attaching the first layer to one broad face of the thin layer;

[H2] Repeating steps A-G to form a second layer; and

[H3] Attaching the second layer to the opposite broad face said thin layer.

Having thus described my invention, what We claim as new and desire to secure by Letters Patent is as follows:

1. A hybrid semiconductor device including first and second electronic circuits each formed upon the top broad face of a different one of two substrates with first and second opposed bottom broad faces separated by a thermal barrier layer; wherein said circuits are conductively interconnected through openings in said substrates and said barrier layer comprises:

at least a first nanostructured protective layer of ceramic platelets having a thickness between 1 and 100 nanometers separated from each other and said bottom broad faces only by means of infused layers of polymeric adhesive having substantially the same thickness as said platelets.

2. A hybrid semiconductor electronic device according to claim 1; wherein:

said ceramic platelets comprise about 6% of the weight of said protective layer.

3. A hybrid semiconductor electronic device according to claim 1; wherein said infused layers are: individual polymer strings.

4. A hybrid semiconductor electronic device according to claim 1; wherein:

said platelets are suspended in a plastic matrix.

5. A hybrid semiconductor electronic device according to claim 1; wherein said barrier layer further includes:

a separate layer of aerogel having first and second broad sides;

said first side being attached to said first protective layer; and the second of said broad sides being attached to said first broad bottom face.

6. A hybrid semiconductor electronic device according to claim 5; wherein said barrier layer further includes:

a second protective layer substantially identical to said first protective layer attached to said second broad bottom face and said second side.

7. A hybrid semiconductor eleatronic device according to claim 1; wherein:

said said first circuit is a far-infrared detector array and said second circuit is a silicon CCD readout device.

8. A hybrid semiconductor electronic device according to claim 3; wherein:

said said first circuit is a far-infrared detector array and said second circuit is a silicon CCD readout device.

9. A hybrid semiconductor electronic device according to claim 4; wherein:

said said first circuit is a far-infrared detector array and said second circuit is a silicon CCD readout device.

10. A hybrid semiconductor electronic device according to claim 5; wherein:

said said first circuit is a far-infrared detector array and said second circuit is a silicon CCD readout device.

11. A hybrid semiconductor electronic device according to claim 6; wherein:

said said first circuit is a far-infrared detector array and said second circuit is a silicon CCD readout device.

* * * * *